FLEXIBLE PIN EXTENSION ADAPTER PLUG

Filed June 12, 1959

INVENTOR.
ANTHONY AVENI
BY Harry M. Saragovitz
ATTORNEY

United States Patent Office 3,035,244
Patented May 15, 1962

3,035,244
FLEXIBLE PIN EXTENSION ADAPTER PLUG

Anthony Aveni, Hollywood, Calif., assignor to the United States of America as represented by the Secretary of the Army Filed June 12, 1959, Ser. No. 819,791
4 Claims. (Cl. 339—156)

This invention relates to electronic systems such as computers, wherein circuit components may be mounted on a large number of generally similar printed-circuit boards arranged to be plugged into chassis units. More particularly, the invention resides in an extension adapter plug for testing the printed circuit boards and the components thereon while they are connected in their respective circuits in the chassis units.

The printed-circuit boards are often used in considerable numbers in computers and the like, and are usually provided with contact pins along one edge to mate with corresponding socket contacts on the chassis units. As normally used these printed-circuit boards are nested closely together in the chassis, to conserve space, making the testing of the components on these boards under operating conditions virtually impossible.

The adapter plug of this invention overcomes this and other difficulties by permitting the board to be tested to be raised above adjacent boards and units, where its components and circuits are readily accessible, with all circuits completed into the main chassis. A particular advantage of the adapter of this invention is that it is capable of being used in any of the positions occupied by boards of similar contact pin arrangements.

The printed circuit boards used in computer and similar systems have keying projections or stops to prevent the boards from being inserted in the wrong positions. Keying is accomplished by omitting certain pins from the boards and by providing means blocking-off the corresponding sockets. The extender-adapter of this invention avoids the necessity for stocking hundreds of extenders since the contact pins may be arranged to match those of any printed-circuit board.

The exact nature of this invention as well as its advantages will be readily apparent from consideration of the following specification taken in connection with the annexed drawings in which.

Figure 1:
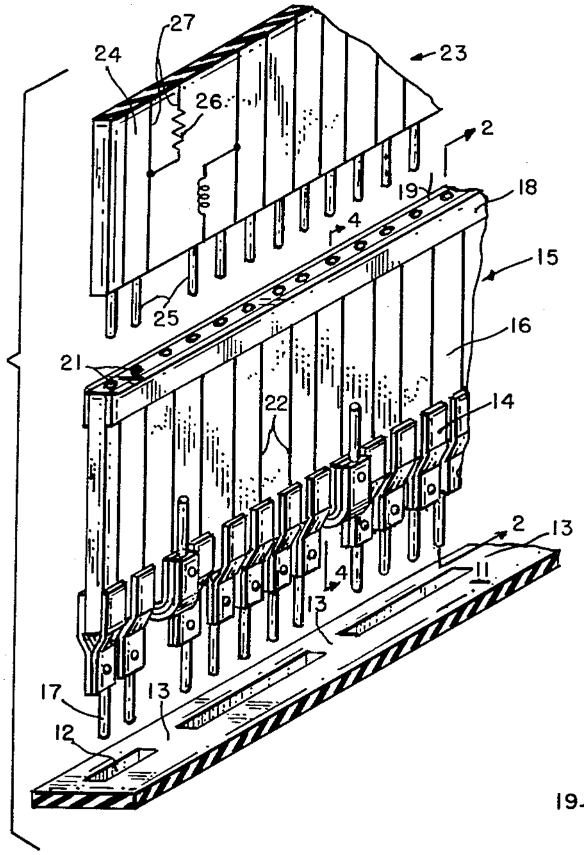
FIGURE 1 shows a preferred embodiment of the invention as it would be assembled with other units.
Figure 2:
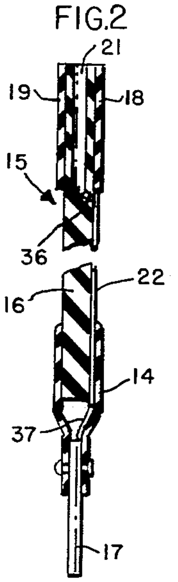
FIGURE 2 shows a section of the invention taken on the line 2—2 of FIGURE 1 looking in the direction of the arrows.

Referring now to the drawings, wherein like reference characters designate like or corresponding parts throughout the several views, there is shown in FIGURE 1 a chassis 11 with slots 12 for accepting pins 25 of printed circuit boards 23. Keying portions 13 located between the slots prevent the printed circuit boards from being inserted in the wrong positions. Individual sockets (not shown) are provided below slots 12 for pins 25. In an actual computer assembly, or the like, a plurality of the printed-circuit boards 23 are plugged into a plurality of closely spaced socket slots 12 to conserve space. However, for simplicity, only a single board 23 and slot 12 are shown in FIG. 1.

Printed circuit board 23 represents the unit to be tested and forms no part of the invention. It is shown in FIGURE 1 in position to be plugged into adapter 15 which, in turn, is plugged into chassis unit 11. Board 23 may be a printed circuit with contact pins 25 affixed to an edge. Circuit components 26 may be positioned on one or both surfaces of board 24 and are electrically connected to pins 25.

Extension adapter plug 15 of the present invention comprises an elongated board 16 with pins 17 hinged to one edge so that they may be individually folded back. Pins 17 may be attached to the edge of the board by cemented flexible material 14, as shown, or by any other suitable hinging means. Pin sockets 21 are located in the upper edge of board 16 between reinforcing members 18 and 19. Pins 17 are electrically connected to sockets 21 by conductors 22. These may be in part printed conductors on board 16, with leads 36 to sockets 21 and flexible conductors 37 connecting them to pins 17.

Figure 3:
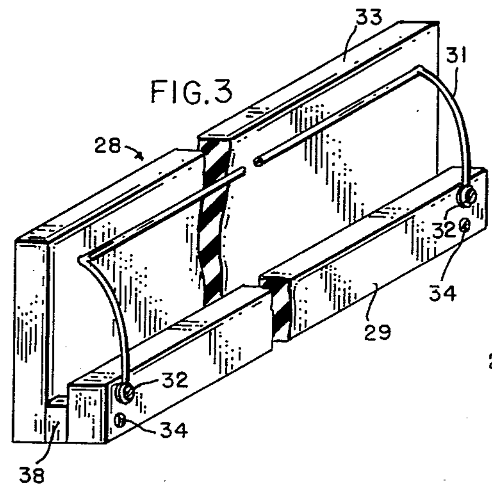
FIGURE 3 shows a clamp that is used with the preferred embodiment of FIGURE 1.
Figure 4:
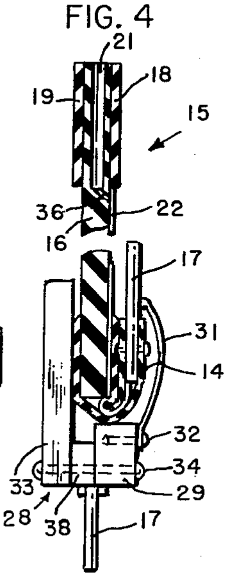
FIGURE 4 shows a section of the invention taken on the line 4—4 of FIGURE 1 looking in the direction of the arrows and including the clamp of FIGURE 3 in assembled relation.

In use, the adapter or extender plug 15 will have certain pins 17 folded upwardly, as shown in FIGURES 1 and 4, so that the pins remaining in the normal downwardly-extended position will correspond to the pins of the board 23 to be tested and will complete those circuits into main assembly unit 11. A single clamp 28, shown detached in FIGURE 3, is used to lock pins 17 in their respective positions, either folded or extended, as the situation may require.

Clamp 28 is made up of two spaced bars 29 and 33 of insulating material, of sufficient length to cover the entire width of the adapter. These bars are held apart by spacers 38 at their ends. Rivets 34 passing through the bars and spacers hold the assembly together. Bars 29 and 33 are so spaced as to rigidly clamp the downwardly-extended pins 17 in that position. A spring wire 31 is used to hold those pins turned upwardly in that position, as shown in FIGURE 4. It extends substantially the length of bar 29, and is held to it by rivets 32. It holds these pins out of the way to prevent their shorting or damaging other components.

To use the extender plug it is necessary only to remove clamp 28, fold upwardly those pins 17 which correspond to the blank spaces between the pins 25 of the board 23 to be tested, and slip the clamp back on extender 15 to lock all the pins in position. The same adapter can be used to test any number of printed circuit units 23 so long as the adapter has the same pin spacing and has a sufficient number of conductors. It permits raising the unit to be serviced well above adjacent units for convenience and speed in testing of components, and at the same time maintains these components "in circuit" with the main assembly using the units 23, for testing under operating conditions. In practice, printed circuit units 23 are usually of a standard size for any particular assembly, so that a single adapter plug may be used to service all the units of the entire assembly. This permits the convenience of testing by an extender adapter but avoids the necessity of stocking a catalog file of extenders for each of the component-carrying boards 23.

The foregoing disclosure relates to a preferred embodiment of the invention. Numerous modifications or alterations may be made therein without departing from the spirit and scope of the invention set forth in the appended claims.

What is claimed is:

1. An extension adapter plug for testing printed circuit boards and the components thereon while the components are connected in their respective circuits in a chassis unit having keying means, said extension adapter plug comprising an elongated board, a first plurality of connecting means hinged to said elongated board, means cooperating with said first plurality of connecting means to retain selected ones of said first plurality of conducting means against a surface of said elongated board to allow mating with said keying means, and a second plurality of connecting means attached to another edge of said elongated board for making electrical contact with said printed circuit boards, and conductors connecting said first and second pluralities of connecting means.

2. An extension adapter plug for connecting a printed circuit board to a chassis having keying portions, said plug comprising an elongated board having a plurality of contact pins hinged on one edge of said elongated board and a plurality of sockets attached to another edge of said elongated board, said pins being capable of being individually folded back against a surface of said elongated board, means interconnecting the respective pins and sockets, and a clamping means gripping said plug and said pins to hold said pins in rigidly in their selected positions.

3. An extension adapter plug for connecting a printed circuit board to a chassis having keying portions, said plug comprising an elongated board; flexible material attached to an edge of said elongated board; a plurality of contact pins individually attached to said flexible material and normally extending in the plane of said elongated board, each of said plurality of pins being capable of being separately folded back against a surface of said elongated board; a plurality of sockets attached to the opposite edge of said elongated board; conductive material connecting said sockets to said pins; and a clamping assembly to lock said pins in their respective positions, said clamping assembly having two spaced bars of insulating material, spacers between said bars at each end of the bars to hold them apart, rivets passing through said bars and spacers to hold said assembly together, and a spring wire attached to one of said bars and extending substantially the length thereof to hold the pins folded upwardly against the surface of said elongated board.

4. An extension adapter plug for testing printed circuit boards and the components thereon while the components are connected in their respective circuits in a chassis unit having socket means with keying portions, said plug comprising an elongated board, a flexible material attached to an edge of said elongated board, a plurality of pins for mating with said socket means attached to said flexible material and normally lying in a plane common with said elongated board, each of said pins being adapted to be folded separately back against a surface of said elongated board to make available a gap for one of said keying portions, a plurality of sockets attached to the opposite edge of said elongated board for making electrical contact with said printed circuit board, conductive material connecting said sockets to said pins, a first clamping bar having a spring wire affixed thereto, a second clamping bar, spacers positioned between said first and second bars at each end thereof, rivets passing through said bars and spacers, said first and second bars being positioned adjacent to said pins on opposite sides thereof for rigid clamping of the downwardly extending pins in that position, said spring wire extending substantially the length of said first bar and being positioned against the pins folded upwardly against the surface of the elongated board.

References Cited in the file of this patent

UNITED STATES PATENTS

| | | |
|---|---|---|
| D. 130,589 | Goodwin | Dec. 2, 1941 |
| 2,478,570 | Crehan | Aug. 9, 1949 |
| 2,487,509 | Baker | Nov. 8, 1949 |
| 2,572,382 | Peterson | Oct. 23, 1951 |
| 2,897,469 | Morse | July 28, 1959 |
| 2,911,609 | Burtt et al. | Nov. 3, 1959 |
| 2,951,185 | Buck | Aug. 30, 1960 |
| 2,952,810 | Helton | Sept. 13, 1960 |
| 2,986,718 | Bender | May 30, 1961 |

FOREIGN PATENTS

| | | |
|---|---|---|
| 203,624 | Australia | Oct. 10, 1956 |